(12) United States Patent
Chen et al.

(10) Patent No.: US 8,154,914 B2
(45) Date of Patent: Apr. 10, 2012

(54) PREDICTIVE THERMAL PRECONDITIONING AND TIMING CONTROL FOR NON-VOLATILE MEMORY CELLS

(75) Inventors: Yiran Chen, Eden Prairie, MN (US); Hai Li, Eden Prairie, MN (US); Harry Hongyue Liu, Maple Grove, MN (US); Dimitar V. Dimitrov, Edina, MN (US); Alan Xuguang Wang, Eden Prairie, MN (US); Xiaobin Wang, Chanhassen, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/016,390

(22) Filed: Jan. 28, 2011

(65) Prior Publication Data

US 2011/0128778 A1 Jun. 2, 2011

Related U.S. Application Data

(63) Continuation of application No. 12/414,452, filed on Mar. 30, 2009, now Pat. No. 7,916,528.

(51) Int. Cl.
*G11C 11/02* (2006.01)
*G11C 7/00* (2006.01)
(52) U.S. Cl. .................. 365/158; 365/189.16
(58) Field of Classification Search .............. None
See application file for complete search history.

(56) References Cited

U.S. PATENT DOCUMENTS

| | | | |
|---|---|---|---|
| 6,771,534 B2 | 8/2004 | Stipe | |
| 6,819,586 B1 | 11/2004 | Anthony et al. | |
| 6,950,335 B2 | 9/2005 | Dieny et al. | |
| 6,963,098 B2 | 11/2005 | Daughton et al. | |
| 7,006,336 B2 | 2/2006 | Coffey et al. | |
| 7,098,494 B2 | 8/2006 | Pakala et al. | |
| 7,110,287 B2 | 9/2006 | Huai et al. | |
| 7,126,202 B2 | 10/2006 | Huai et al. | |
| 7,180,770 B2 | 2/2007 | Perner et al. | |
| 7,224,601 B2 | 5/2007 | Panchula | |
| 7,286,395 B2 | 10/2007 | Chen et al. | |
| 7,339,817 B2 | 3/2008 | Nickel et al. | |
| 7,342,169 B2 | 3/2008 | Venkatasubramanian et al. | |
| 7,345,911 B2 | 3/2008 | Min et al. | |
| 7,349,243 B2 | 3/2008 | Lin et al. | |
| 7,379,327 B2 | 5/2008 | Chen et al. | |
| 7,479,193 B1 | 1/2009 | Clark et al. | |
| 7,486,545 B2 | 2/2009 | Min et al. | |
| 7,660,151 B2 | 2/2010 | Leuschner | |

(Continued)

OTHER PUBLICATIONS

Chris H. Kim, et al., "Dynamic Vt SRAM: A Leakage Tolerant Cache Memory for Low Voltage Microprocessors," ISLPED '02, Aug. 2002, pp. 251-254, US.

(Continued)

*Primary Examiner* — Hoai V Ho
*Assistant Examiner* — James G Norman
(74) *Attorney, Agent, or Firm* — Fellers, Snider, et al.

(57) ABSTRACT

A method and apparatus for using thermal preconditioning to write data to a non-volatile memory cell, such as a spin-torque transfer random access memory (STRAM) memory cell. In some embodiments, a logical state is written to an unconditioned non-volatile first memory cell associated with a first block address. Thermal preconditioning is concurrently applied to a non-volatile second memory cell associated with a second block address selected in response to the first block address.

20 Claims, 6 Drawing Sheets

U.S. PATENT DOCUMENTS

| | | | |
|---|---|---|---|
| 2005/0018475 | A1 | 1/2005 | Tran et al. |
| 2005/0104146 | A1 | 5/2005 | Nickel et al. |
| 2005/0150535 | A1 | 7/2005 | Samavedam et al. |
| 2005/0150537 | A1 | 7/2005 | Ghoshal |
| 2006/0215444 | A1 | 9/2006 | Perner et al. |
| 2009/0010040 | A1 | 1/2009 | Takase |
| 2009/0073750 | A1* | 3/2009 | Leuschner .................... 365/158 |

OTHER PUBLICATIONS

I. L. Prejbeanu, et al., "Thermally assisted MRAM," Journal of Physics Condensed Matter 19, 2007, pp. 1-23, IOP Publishing, UK.

Jan-Ulrich Thiele, et al., "FeRh/FePt exchange spring films for thermally assisted magnetic recording media," Applied Physics Letters, 2003, pp. 2859-2861, vol. 82, No. 17, American Institute of Physics.

Jan-Ulrich Thiele, et al., "Magnetic and Structural Properties of FePt-FeRh Exchange Spring Films for Thermally Assisted Magnetic Recording Media," IEEE Transactions on Magnetics, Jul. 2004, pp. 2537-2542, vol. 40, No. 4, IEEE.

Jan-Ulrich Thiele, et al., "Spin dynamics of the antiferromagnetic-to-ferromagnetic phase transition in FeRh on a sub-picosecond time scale," Applied Physics Letters, Oct. 4, 2004, pp. 2857-2859, vol. 85, No. 14, American Institute of Physics.

Kojiro Yagami, et al., "Inspection of Intrinsic Critical Currents for Spin-Transfer Magnetization Switching," IEEE Transactions on Magnetics, Oct. 2005, pp. 2615-2617, vol. 41, No. 10, IEEE.

Li Zhang, et al., "Heat-assisted magnetic probe recording on a granular CoNi/Pt multilayered film," Journal of Physics D: Applied Physics 39, 2006, pp. 2485-2487, IOP Publishing, UK.

Yuankai Zheng, et al., "Magnetic Random Access Memory (MRAM)," Journal of Nanoscience and Nanotechnology, 2007, pp. 117-137, vol. 7, American Scientific Publishers, USA.

Y. K. Zheng, et al., "Multistate Per-Cell Magnetoresistive Random-Access Memory Written at Curie Point," IEEE Transactions on Magnetics, Sep. 2002, pp. 2850-2852, vol. 38, No. 5, IEEE.

* cited by examiner ized by the various embodiments of the present invention can be
PREDICTIVE THERMAL PRECONDITIONING AND TIMING CONTROL FOR NON-VOLATILE MEMORY CELLS

BACKGROUND

Data storage devices generally operate to store and retrieve data in a fast and efficient manner. Some storage devices utilize a semiconductor array of solid-state memory cells to store individual bits of data. Such memory cells can be volatile or non-volatile.

Volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell operation, particularly with regard to the writing of data to the memory cells.

SUMMARY

Various embodiments of the present invention are generally directed to a method and apparatus for using thermal preconditioning to write data to a non-volatile memory cell, such as a spin-torque transfer random access memory (STRAM) memory cell.

In accordance with some embodiments, the method generally comprises writing a logical state to an unconditioned non-volatile first memory cell associated with a first block address. Thermal preconditioning is concurrently applied to a non-volatile second memory cell associated with a second block address selected in response to the first block address.

In accordance with further embodiments, the apparatus generally comprises a control circuit, an unconditioned non-volatile first memory cell associated with a first block address and an unconditioned second non-volatile memory cell associated with a second block address. The control circuit is configured to write a logical state to the first memory cell while concurrently applying thermal preconditioning to the second memory cell, wherein the second memory cell is selected for said thermal preconditioning in response to the first block address.

These and other features and advantages which characterize the various embodiments of the present invention can be understood in view of the following detailed discussion and the accompanying drawings.

DETAILED DESCRIPTION

Figure 1:
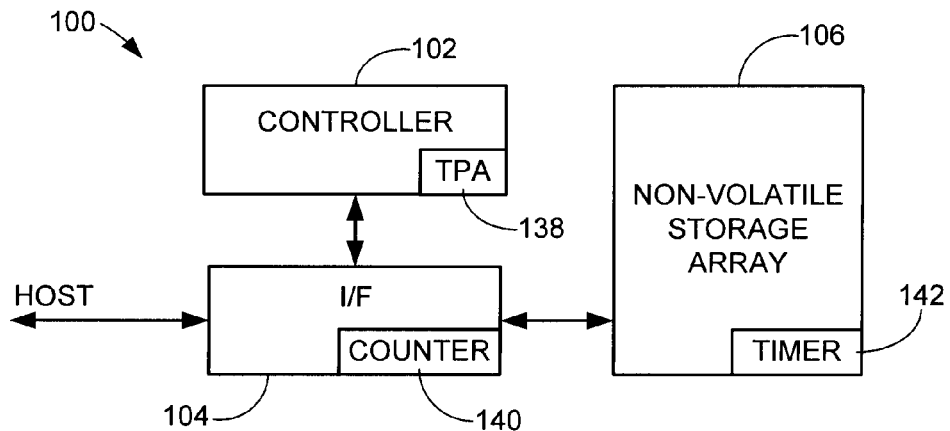
FIG. 1 is a generalized functional representation of an exemplary data storage device constructed and operated in accordance with various embodiments of the present invention.

FIG. 1 provides a functional block representation of a data storage device 100 to illustrate an exemplary environment in which various embodiments of the present invention can be advantageously practiced. The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the device is characterized as a solid-state drive (SSD), the controller 102 is a programmable microcontroller, and the array 106 comprises an array of nonvolatile memory cells (unit cells).

Figure 2:
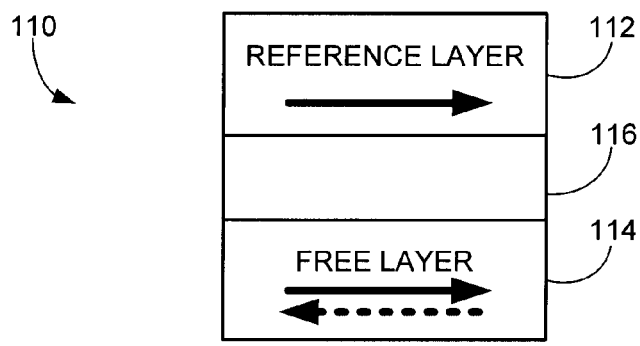
FIG. 2 shows an exemplary construction of a magnetic tunneling junction (MTJ) of a spin-torque transfer random access memory (STRAM) memory cell.

An exemplary memory cell construction for the array 106 is shown in FIG. 2. The memory cell in FIG. 2 has a spin-torque transfer random access memory (STRAM) configuration with a magnetic tunneling junction (MTJ) 110, although other cell configurations can be used. The MTJ 110 includes a fixed reference layer 112 and a programmable free layer 114 (recording layer) separated by an intervening tunneling (barrier) layer 116.

The reference layer 114 has a fixed magnetic orientation in a selected direction, as indicated by the associated arrow shown in FIG. 2. This fixed magnetic orientation can be established in a number of ways, such as via pinning to a separate magnet (not shown). The free layer 114 has a selectively programmable magnetic orientation that can be parallel (solid arrow) or anti-parallel (dotted arrow) with the selected direction of the reference layer 114.

A low resistance state for the MTJ 110 is achieved when the magnetization of the free layer 114 is oriented to be substantially in the same direction (parallel) as the magnetization of the reference layer 112. To orient the MTJ 110 in the parallel low resistance state, a write current passes through the MTJ 110 so that the magnetization direction of the reference layer 112 sets the magnetic orientation of the free layer 114. Since electrons flow in the direction opposite to the direction of current, the write current direction passes from the free layer 114 to the reference layer 112, and the electrons travel from the reference layer 112 to the free layer 114.

A high resistance state for the MTJ 110 is established in the anti-parallel orientation in which the magnetization direction of the free layer 114 is substantially opposite that of the reference layer 112. To orient the MTJ 110 in the anti-parallel resistance state, a write current passes through the MTJ 110 from the reference layer 112 to the free layer 114 so that spin-polarized electrons flow into the free layer 114 in the opposite direction.

A different logical state is assigned to each of the programmable resistances of the MTJ. In some embodiments, the low resistance, parallel state is used to represent a logical 0, and the high resistance, anti-parallel state is used to represent a logical 1. Additional programmed states can be used when the MTJ is configured to store multiple bits. For example, programmed resistances R1<R2<R3<R4 can be used to respectively store multi-bit values "00," "01," "10" and "11."

Figure 3:
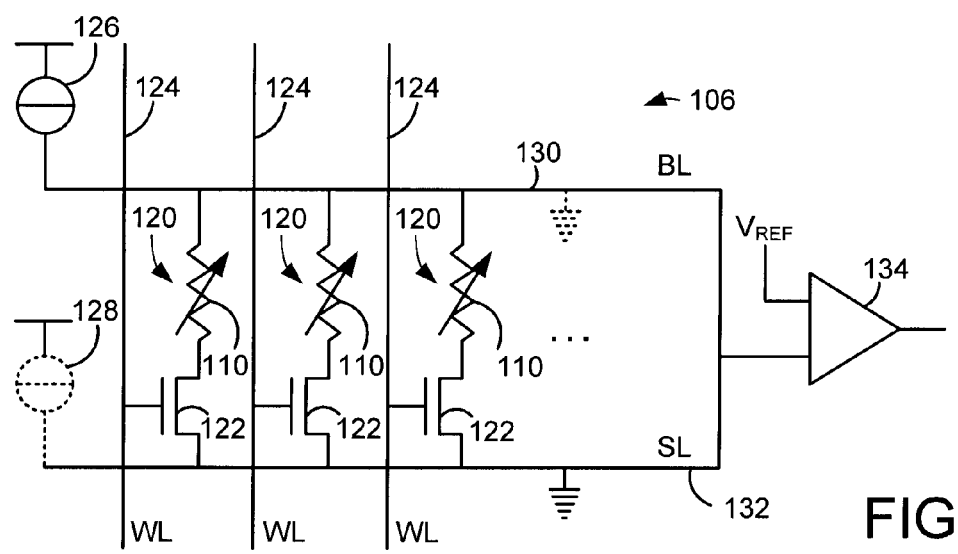
FIG. 3 sets forth a schematic representation of portions of the array of FIG. 1 using STRAM memory cells as configured in FIG. 2.

FIG. 3 shows a portion of the array 106 of FIG. 1 with non-volatile memory cells 120. Each memory cell 120 includes an MTJ 110 as set forth in FIG. 2 coupled to a switching device 122, characterized as a metal oxide semiconductor field effect transistor (MOSFET). The cells 120 are individually accessed by asserting word lines WL 124 to place the associated cell transistors 122 in a drain-to-source conductive state.

Programming (write) currents are respectively generated by write current drivers 126, 128. The write currents are passed between a bit line BL 130 and a source line SL 132 to program the selected MTJ 110 to the desired programmed state. To subsequently read the programmed state of a selected cell 120, the associated WL 124 is asserted and a read current is passed by a read current driver (not separately shown) to establish a voltage drop across the cell 110. This voltage drop is sensed by a sense amplifier 134 and compared to an input reference voltage $V_{REF}$. The output state of the sense amplifier 134 (e.g., high, low) will indicate the programmed state of the MTJ 120 of the selected cell 110.

Large magnitudes of programming current can be required to switch the programmed states of the MTJs 120, particularly to the anti-parallel (high resistance) state. This can require the use of relatively large cell transistors 122, which limits achievable memory array densities. The use of large programming currents can also result in higher dynamic power consumption of the array, and can require a costly on-chip power delivery system.

The switching current for an STRAM MTJ such as 120 can be expressed as:

$$\frac{J}{J_c} = 1 - \frac{K_b T}{E} \ln \frac{\tau}{\tau_0} \quad [1]$$

Where J is the switching current density; $J_c$ is the critical switching current density at 0 degrees K; E is the energy barrier for magnetic switching; $\tau$ is the switching time, $\tau_0$ is the attempt time for thermal switching and T is the temperature in degrees K. While a reduction in switching current can be accommodated by increasing the duration of the driving pulse width $\tau$, this can reduce overall data throughput rates.

Another way to reduce switching current requirements is to increase the temperature T of the MTJ through thermal preconditioning, or localized heating of the MTJ prior to the switching event. The widescale application of thermal preconditioning to large numbers of cells, however, can increase overall power requirements and may result in the heating of many cells that are not actually written.

Accordingly, various embodiments of the present invention are generally directed to providing probabilistic (predictive) thermal preconditioning of memory cells in a non-volatile array. As explained below, an address of a first memory cell subjected to a write operation is used to predict a next address of a second memory cell that may be subjected to a write operation in the near future. Thermal preconditioning is applied to the second memory cell concurrently with the writing of the state to the first memory cell.

In this way, should the second memory cell be subsequently subjected to a write operation, the write operation upon the second memory cell will be thermally assisted, that is, take place while the second memory cell is at an elevated temperature, thereby reducing the magnitude of switching current required to switch the programmed state.

The address of the second memory cell can be used to predict a write operation to a third memory cell which is thermally preconditioned, and so on. In some embodiments, the use of thermal preconditioning in this manner can reduce both current requirements and write current pulse widths, leading to data throughput rate enhancements and decreased power consumption.

The predictive thermal preconditioning can be based on addresses of memory cells for which write data have been received. In some embodiments, a write command for the cells of a selected logical data block with an address N can result in the application of preconditioning for the cells in a data block N+1, based on a speculative prediction that a sequential write operation is underway in which blocks N, N+1, N+2 . . . may be successively written in the near future.

The logical data blocks N, N+1, N+2 . . . can be any suitable grouping of memory cells, such as an addressable sector of data (e.g., 512 bytes of user data) associated with a host level logical block address (LBA). The data blocks can constitute a row of memory cells in an array, such as 1024 bytes of data in a 32 KB memory unit (32 rows by 8192 columns, etc.), or portions of the same row of memory cells. The data blocks can also be defined as individual cells.

The preconditioned cells can be located at any selected location within one or more arrays, and may not necessarily be adjacent to the initial set of written cells that did not receive preconditioning (i.e., "unconditioned" or "non-preconditioned" cells). The set of memory cells being probabilistically preconditioned can comprise memory cells having successive logical addresses, logical addresses of dissimilar word lines, or a number of logical addresses that are less than the number of cells connected by a single word line. Although the first written block N will be unconditioned and will thus be written at a slower rate and/or at a higher current, each of the preconditioned blocks N+1 etc. will be subsequently written at a faster rate and/or lower current, resulting in overall higher data transfer rates and lower power consumption.

Referring again to FIG. 3, the thermal preconditioning can be applied in a number of ways, such as by the application of a relatively small driving current to the second (and subsequent) memory cells. For example, a write operation to a first MTJ 110 in FIG. 3 can trigger the application of a relatively small current to a second MTJ 110, such as by a partial assertion of the associated WL.

Figure 4:
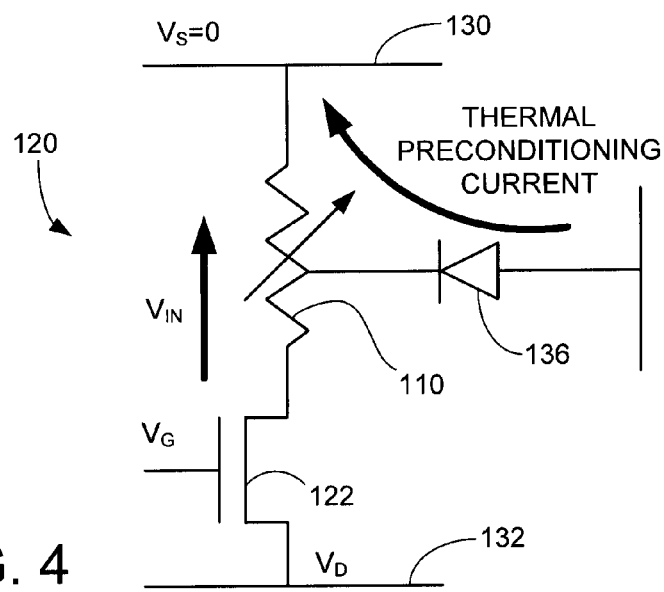
FIG. 4 shows another schematic representation of portions of the array of FIG. 1 with thermal preconditioning diodes.

Alternatively, the thermal preconditioning can utilize a variety of components configured to raise the temperature of an MTJ 110 upon selection. FIG. 4 shows a configuration for portions of the memory array 106 of FIG. 1 in accordance with further embodiments. The circuitry of FIG. 4 is generally similar to that set forth in FIG. 3, and like reference numerals are used for similar components.

In FIG. 4, thermal assist mechanisms such as diodes 136 are coupled to the respective MTJs 110 to facilitate the application of heating current thereto prior to a write operation. The diodes 136 can take any number of suitable forms, such as but not limited to Zener, Schottky, and Esaki diodes. When selected MTJs 110 are identified as candidates for preconditioning, low level currents are supplied by a suitable source (not shown) through the diodes to the cells 120, providing localized heating of the MTJs 110.

A number of different approaches can be implemented to limit the extent to which thermal preconditioning is applied. In some embodiments, an external signal can be generated by the system to terminate the thermal conditioning sequence. A controller such as 102 in FIG. 1 can implement a thermal preconditioning algorithm (TPA) 138 that maintains a look ahead preconditioning sequence each time a write command and associated write data are received from the host.

For example, for each received block of write data, the controller 102 can identify to the array 106 some selected number of additional successive blocks to which thermal preconditioning should be subjected, and this will continue until no further write commands are received from the host. The controller 102 can further signal the array 106 that the writing operation is finished, thereby terminating any ongoing preconditioning operations.

In an alternative embodiment, a counter can be added for each memory block (or multiple adjacent memory blocks) for timing control, such as indicated by a counter circuit 140 in FIG. 1. Continued receipt of write commands can reinitiate the timer, or initiate counts using new timers. When a number of counted clock cycles reaches a predetermined elapsed time threshold, the applied thermal assistance can be removed.

Figure 5:
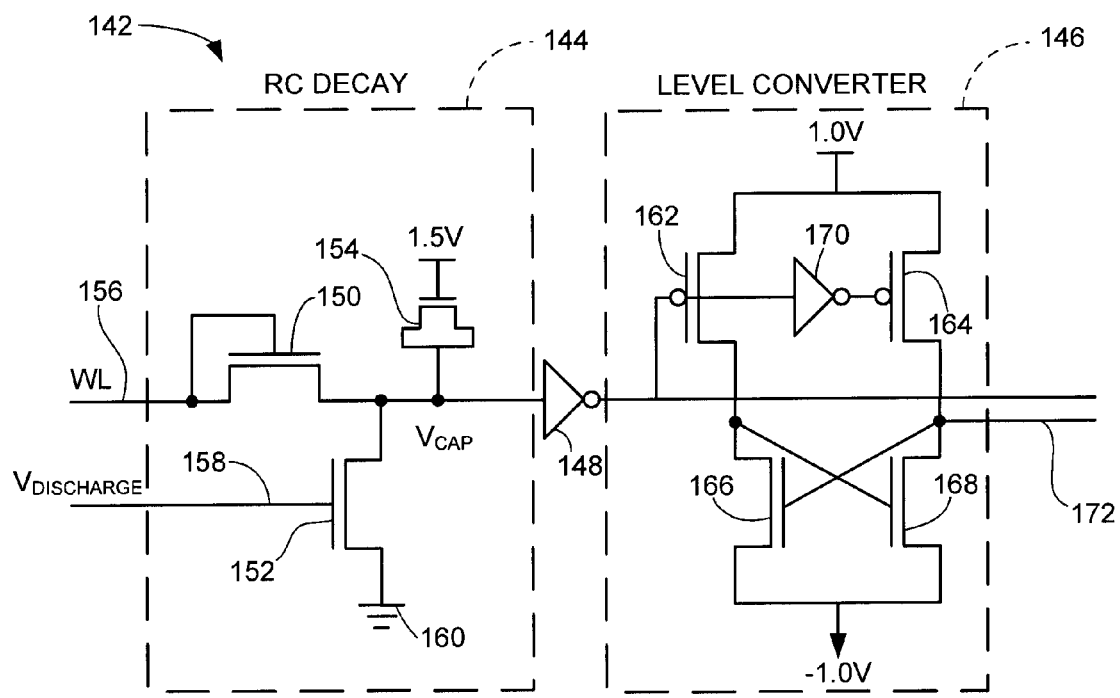
FIG. 5 is a schematic diagram of a timing circuit in accordance with various embodiments of the present invention.

Another timing control mechanism can be implemented via a timing circuit 142 in the array 106 of FIG. 1. As shown in FIG. 5, in some embodiments the timing circuit 142 can be characterized as an RC-based circuit that generally operates to detect voltage discharging due to an RC delay, and terminates further application of thermal preconditioning when the decaying RC voltage reaches a predetermined threshold.

The timing circuit 142 in FIG. 5 includes a decay circuit 144 and a level converter 146. An inverter 148 is coupled between the respective decay circuit 144 and level converter 146. The decay circuit 144 includes transistors 150, 152 and a capacitor 154. The capacitor 154 stores a voltage $V_{CAP}$ in relation to a rail voltage (in this case, 1.5V) and a word line WL 156. A discharge line 158 facilitates RC discharge of the $V_{CAP}$ voltage to ground 160 via a $V_{DISCHARGE}$ input.

The level converter 146 includes transistors 162, 164, 166 and 168 and inverter 170 cross-connected as shown between rail voltages of 1.0V and −1.0V. Once the voltage $V_{CAP}$ stored on the capacitor 154 falls below the threshold input of the inverter 150, a change in output on path 172 signals a termination of the precharging operation. It will be appreciated in these and other related timing mechanisms as contemplated herein, an elapsed time interval can be predefined, and the preconditioning is terminated at the conclusion of the time interval for any and all preconditioned cells to which data have not been written. This further serves to reduce power consumption since the occurrence of unnecessary preconditioning currents can be reduced.

Figure 6:
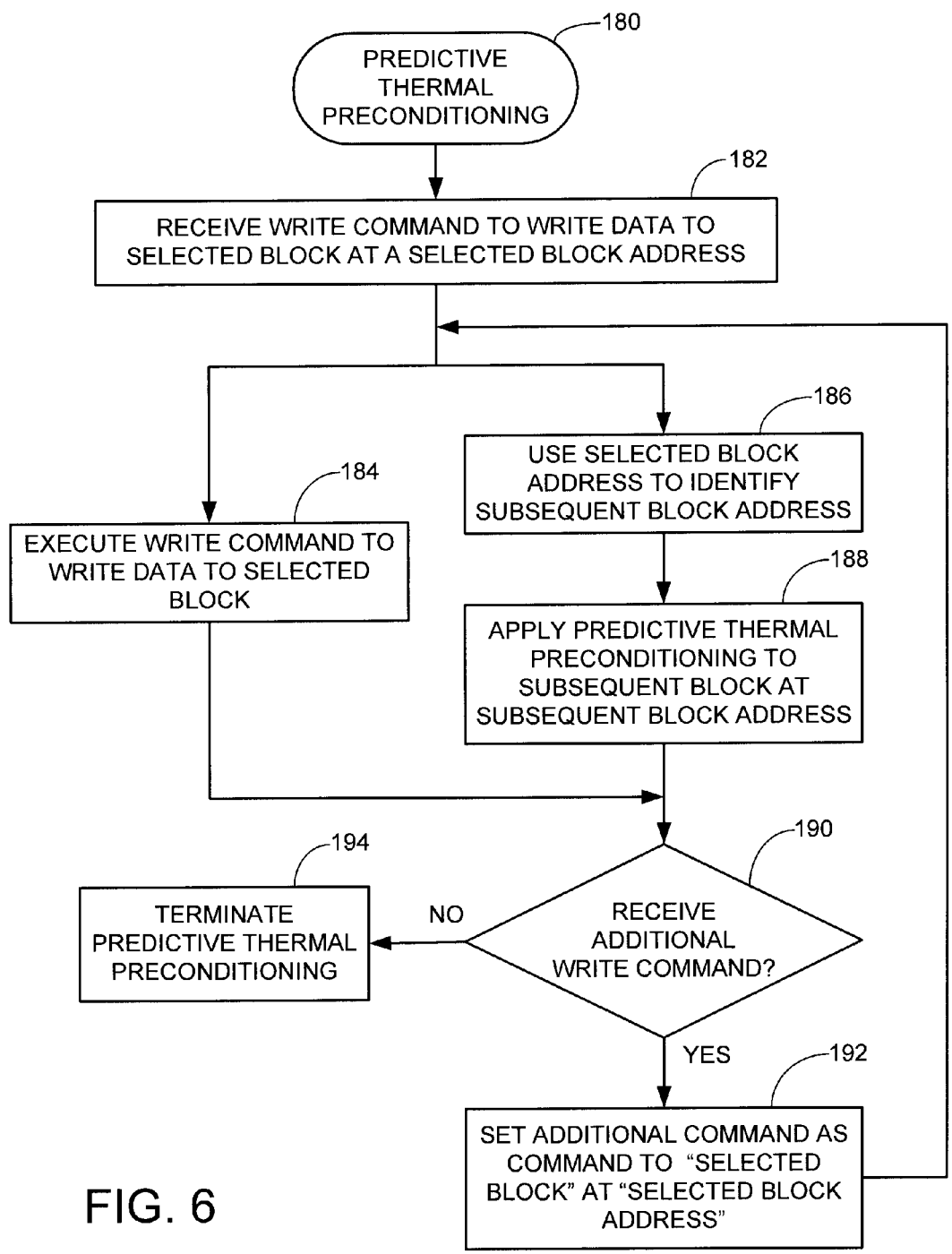
FIG. 6 sets forth a flow chart for a PREDICTIVE THERMAL PRECONDITIONING routine.

FIG. 6 sets forth a PREDICTIVE THERMAL PRECONDITIONING routine 180 generally illustrative of steps carried out in accordance with various embodiments. It is contemplated that the routine of FIG. 6 is carried out by a suitable control circuit, such as the controller 102 in FIG. 1. At step 182, a write command is received by a device such as 100 in FIG. 1 to write data to an array such as 106 at a selected block at a selected block address. The device proceeds to execute the write command at step 184, and concurrently uses the selected block address to identify a subsequent block address (or addresses) to which a write operation may be received in the near future, step 186. The device proceeds to concurrently apply thermal preconditioning to the subsequent block address (or addresses) at step 188 during the writing to the selected block at step 184.

Decision step 190 determines whether an additional write command has been received by the host. This command may be for the subsequent block address, or for some other block address. If so, the routine may pass to step 192 where the additional write command is treated as a "selected block" at a "selected block address," and the flow returns as shown. The routine will continue in this fashion until no additional write commands are received, at which point further preconditioning is terminated, step 194.

Figure 7:
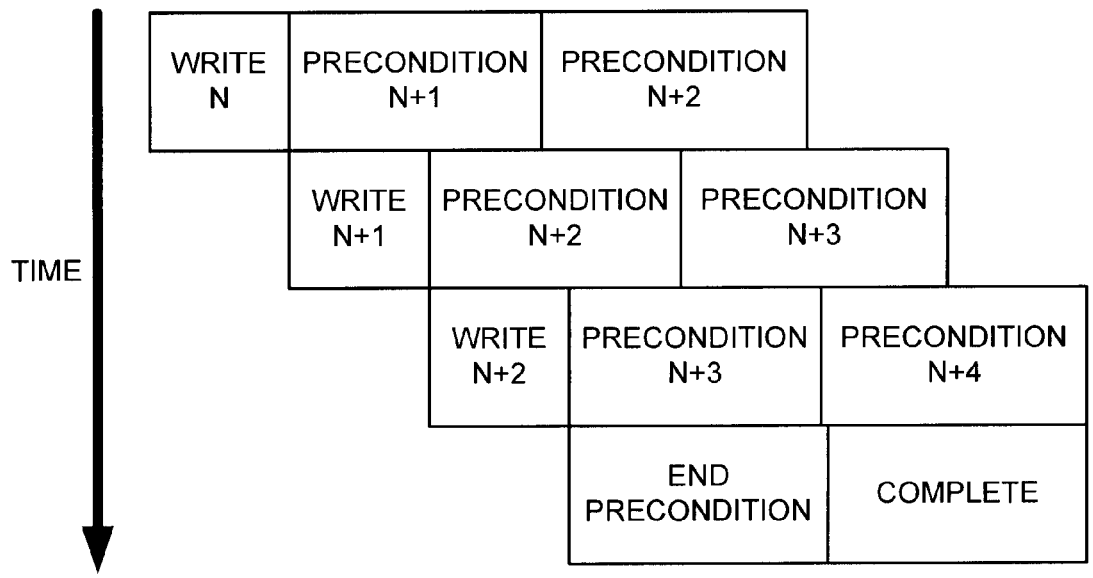
FIG. 7 is a timing diagram for selectively preconditioning memory cells during a data write operation in accordance with some embodiments.

FIG. 7 provides a timing sequence corresponding to the routine 180 of FIG. 6 for predictive preconditioning in an array in accordance with some embodiments. When writing data to a first memory block N, thermal preconditioning is concurrently applied to successive memory blocks N+1 and N+2. A subsequent write operation to block N+1 results in continued preconditioning of block N+2 plus concurrent preconditioning of a subsequent block N+3, and so on. This processing can continue, or time out as required.

Figure 8:
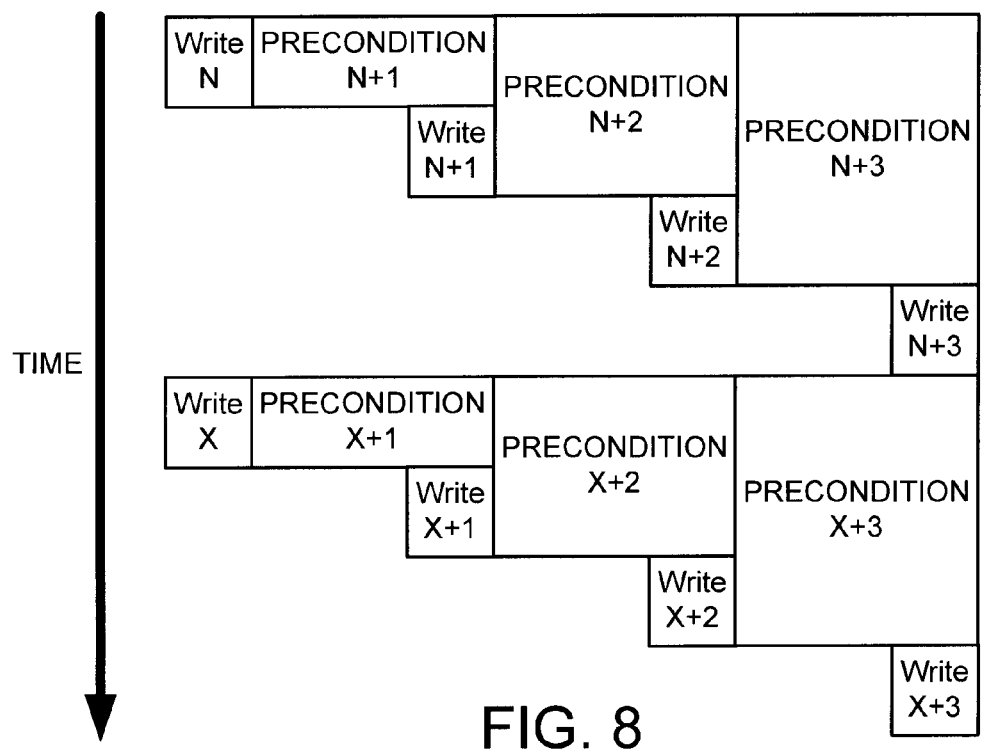
FIG. 8 is a timing diagram for selectively preconditioning memory cells during a data write operation in accordance with further embodiments.

FIG. 8 shows an alternative timing sequence. A write operation to a first memory block N results in the application of predictive thermal preconditioning to a selected range of blocks N+1, N+2 and N+3. The thermal conditioning remains applied to each of these blocks until write operations are carried out thereto or a timeout condition is declared.

It is noted that the execution of subsequent writes to these other blocks does not trigger further preconditioning efforts; for example, the writing to preconditioned blocks N+1, N+2 or N+3 does not serve to trigger the further preconditioning of blocks N+4, N+5, etc. Rather, a set range of blocks is initially preconditioned based on the initial unconditioned block address, and writes are either carried out to these blocks or the preconditioning is terminated at the appropriate time out period conclusion. The actual writing to a given block undergoing preconditioning may serve to terminate further preconditioning of that block. Such is not necessarily required, however, particularly in cases where multiple updated writes are anticipated (or detected).

Receipt of a new write command to a different block X in FIG. 8 similarly results in the application of continuous thermal preconditioning to blocks X+1, X+2 and X+3 until data are written thereto or a timeout condition is declared.

While it is contemplated that sequential writes in a memory array will often be based on an anticipated incrementally increasing write sequence (e.g., blocks N, N+1, N+2, N+3 . . . ) it will be appreciated that the above approach can be adapted to other conditions. A decreasing sequence of block addresses may be detected (e.g., blocks N, N−1, N−2, N−3), resulting in the predictive preconditioning of blocks with decreased addresses. The receipt of non-sequential write commands, given sufficient temporal and spatial locality of the associated blocks within a given range, can result in the selection of predictive preconditioning to other blocks within that range.

File allocation tables (FATs) or other data structures maintained by the device 100 may provide logical association information for blocks with otherwise non-local addresses. For example, a given data structure may provide a higher level association of a grouping of blocks such as blocks N, N+2, N+6, N+17, etc. Thus, a write operation to a selected block within the group, say N+2, may lead to a preconditioning decision for other blocks at other addresses as identified by such data structures (e.g., blocks N, N+6, N+17 . . . ).

While the foregoing discussion has contemplated the application of predictive write preconditioning to cells in a memory array such as 106, such preconditioning can be readily applied to cells in other types of memory structures, such as caches. As will be appreciated, devices such as 100 can utilize such caches to provide intermediary storage of data during transfers between the host and the array 106.

One such cache may be a data buffer in the I/F 104 that temporarily stores input user data pending encoding and storage to the array 106, and which stores readback data retrieved from the array pending transfer to the host. Localized caches may also be provided at the controller level, such as L1, L2 and/or L3 caches to store data and/or control information such as programming instructions or status data.

Figure 9:
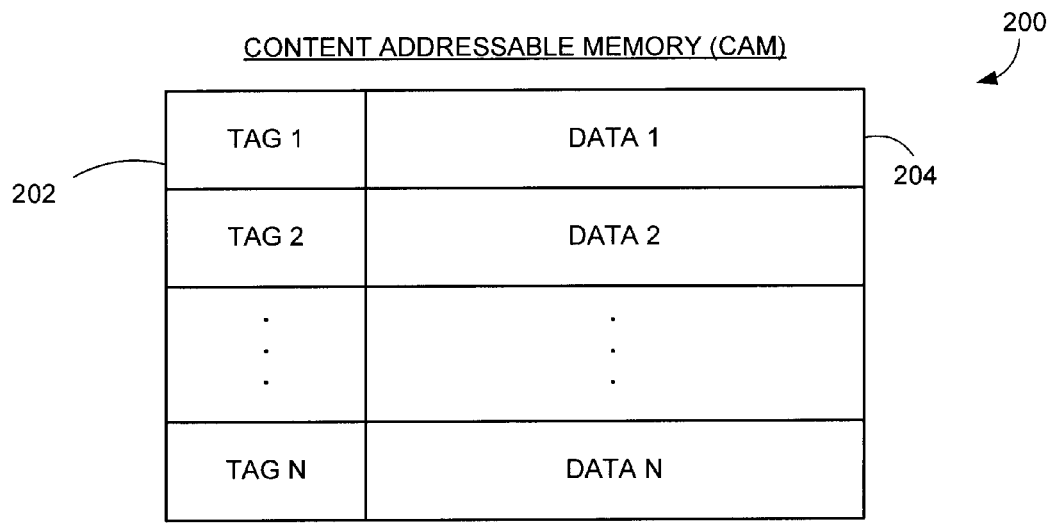
FIG. 9 is a block diagram representation of a cache memory structure of the device of FIG. 1 configured as a content addressable memory (CAM).

FIG. 9 provides a functional representation of an associative memory 200 (cache) having a content addressable memory (CAM) configuration. CAM based associative memories have found widespread use in a number of applications such as computer system cache, network routers, and various embedded applications.

The cache 200 is arranged to have a number of cache lines (rows) each with an index field 202 and a word data field 204. The index field 202 stores tag data which serves as an identifier for the associated word data in field 204. The tag data can take any number of desired forms, and can be expressed as a multi-bit value associated with some other address of the word data (such as a block address in another location in memory, such as the array 106).

The cache 200 is generally accessed during a data retrieval operation by proving input search data which is quickly compared to the tag data in the respective index fields 202. When a match is found, the corresponding word data from the associated word data field 204 is output. Depending on the size and arrangement of the cache 200, the search can be executed over a single clock cycle, making the CAM structure faster than many other hardware or software based search systems.

Data in a cache such as 200 are often provided with temporal locality with respect to locations in the cache in which the data are stored. This is because data may be sequentially ordered within the cache in relation to the sequence in which the data were provided thereto. Moreover, multiple rows of data may be cached at the same time as groups of data are moved to the cache depending on loading requirements. Thus, a write operation to a particular cache line may be followed in the near future by subsequent write operations to cache lines that precede and/or come after the written cache line.

Figure 10:
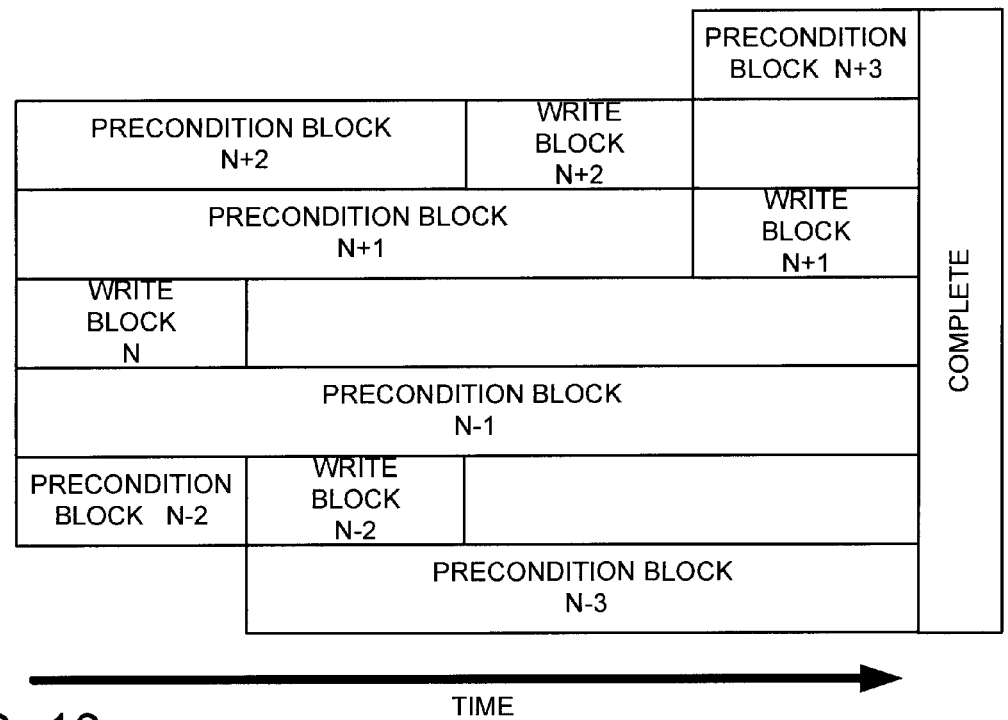
FIG. 10 shows a timing diagram for selectively preconditioning memory cells of the CAM of FIG. 9 in accordance with some embodiments.

Preconditioning can be applied to caches such as 200 in accordance with the timing diagram of FIG. 10. In FIG. 10, a write command is executed to write new data to a selected word data line 204. These data have an associated block address which will be referred to herein as address N. The address N may be a localized cache address (e.g., a row indicator via index fields 202) or may be a global block address, such as an LBA at the host level, a row-block address at the array level, etc.

In FIG. 10, the writing of data to block N in the cache 200 results in a concurrent predictive thermal preconditioning operation upon blocks that both precede and follow the address of block N, that is, blocks N−2, N−1, N+1 and N+2. Other ranges can be used, including asymmetric ranges (e.g., blocks N−3 to N+4, etc.). It will be appreciated that the writing of data to the cache 200 may result in the overwriting of existing data, as in the case of the array 106.

A subsequent writing of data for block N−2 initiates the concurrent preconditioning of block N−3, and a subsequent writing of data for block N+2 initiates preconditioning of block N+3. As before, the first block written (block N) is unconditioned and is therefore slower and/or requires higher write current, but the preconditioning allows greater efficiencies in the subsequent writing of the preconditioned blocks. A suitable timing mechanism is employed to halt further preconditioning efforts once the write operations cease, such as the various mechanisms 138, 140 and/or 142 discussed above in FIGS. 1, 4 and 5.

Figure 11:
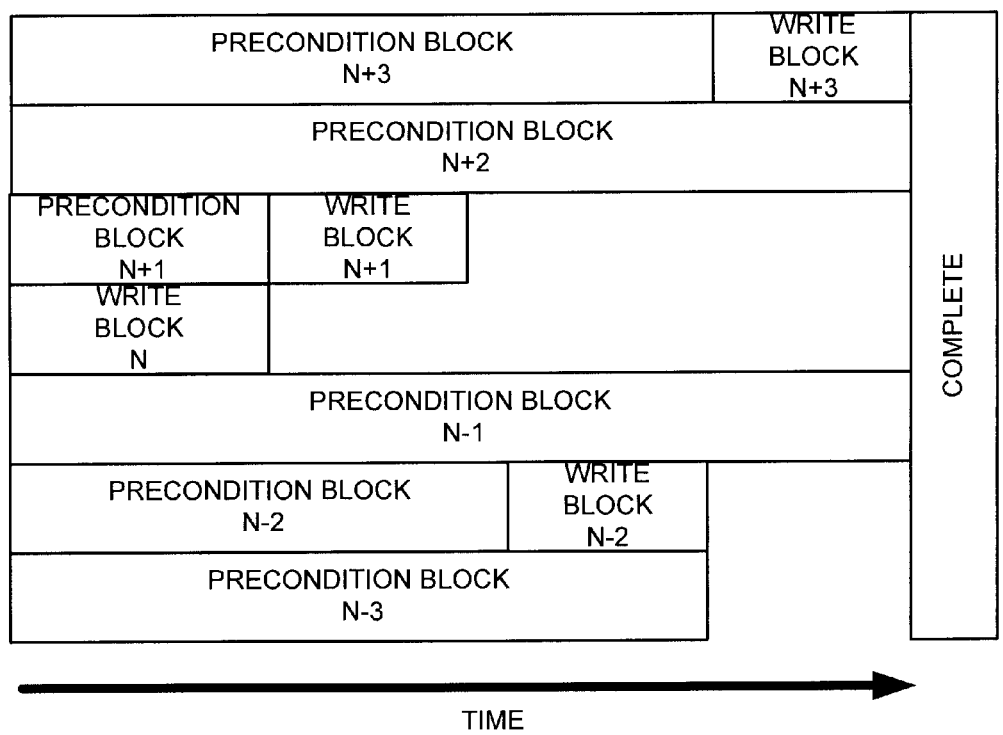
FIG. 11 shows a timing diagram for selectively preconditioning memory cells of the CAM of FIG. 9 in accordance with some embodiments.

FIG. 11 provides an alternative timing sequence for writing data to a cache such as 200. In FIG. 11, the initial writing to an unconditioned block N results in the preconditioning of a larger range of blocks N−3 to N+3. Subsequent writes to these other blocks, however, do not trigger further preconditioning efforts. As before, the preconditioning continues until actively terminated.

As can be appreciated by one skilled in the art, the various embodiments illustrated herein provide advantages in both memory cell efficiency and accuracy due to the writing of data to memory cells that have been preconditioned. Substantial power and time savings can be experienced by the intelligent selection of only those cells that should be preconditioned based on a prediction of future write operations. The use of a timing mechanism further provides power and time savings by providing a way to terminate further preconditioning responsive to changing data load conditions. The various embodiments discussed herein have numerous potential applications and are not limited to a certain field of electronic media or type of data storage devices.

For purposes of the appended claims, the term "concurrently" and the like will be construed consistent with the foregoing discussion to describe operations that overlap in time, even if such operations individually commence or end at different times. The term "unconditioned" and the like will be construed consistent with the foregoing discussion to describe a memory cell to which thermal preconditioning has not been applied immediately prior to a write operation thereto.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory device, comprising:
a plurality of non-volatile memory cells; and
a write circuit adapted to flow a write current through an unconditioned first selected cell having a first block address associated with a pending write command received from a host to write the first selected cell to a selected data state, and to concurrently pass a thermal preconditioning current through a second selected cell having a second block address not associated with any pending write command received from a host, the second block address selected in response to the first block address.

2. The memory device of claim 1, in which each memory cell in said plurality comprises a magnetic tunneling junction (MTJ) and a switching device characterized as a transistor having respective gate, drain and source regions, a drain-source channel of said transistor connected in series with the MTJ.

3. The memory device of claim 1, in which each memory cell in said plurality of memory cells is coupled to respective first, second, third and fourth control lines, the write current passing between said first and second control lines of the first selected cell, the thermal preconditioning current passing from said third control line to the first control line of the second selected cell.

4. The memory device of claim 1, in which the second selected cell comprises a magnetic tunneling junction (MTJ), a transistor switching device, and a diode coupled to the MTJ, the thermal preconditioning current passing through the diode to the MTJ.

5. The memory device of claim 1, in which the array of non-volatile memory cells are arranged in said array in a plurality of rows and a plurality of columns, the first selected memory cell is disposed on a first row and a first column of the array, and the second selected memory cell is positioned on a different second row and a different second column of the array.

6. The memory device of claim 1, further comprising a controller which, responsive to receipt of a write command to write the selected data state to the first selected memory cell at the first block address, uses the first block address to identify the second block address of the second selected memory cell so as to predict a future receipt of a subsequent write command for the second memory cell.

7. The memory device of claim 1, in which the first and second block addresses are respective host level logical block addresses (LBAs).

8. The memory device of claim 1, in which the first block address is characterized as a block address N, and the second block address is characterized as a block address N+1.

9. The memory device of claim 1, in which the thermal preconditioning current increases a temperature of the second selected memory cell, and the write circuit is further adapted to write a selected data state to the second selected memory cell while the second selected memory cell retains an increased temperature.

10. The memory device of claim 1, further comprising a timing circuit which initiates a predetermined time interval responsive to the writing of the selected data state to the first selected memory cell, the write circuit discontinuing further application of the thermal preconditioning current to the second selected memory cell at a conclusion of the predetermined time interval.

11. A solid-state memory, comprising:
an array of non-volatile memory cells, each cell comprising a programmable magnetic tunneling junction (MTJ) in series with a switching device to facilitate a flow of write current between a first control line connected to the MTJ opposite the switching device and a second control line connected to the switching device opposite the MTJ, each said cell further comprising a diode connected to the associated MTJ to facilitate a flow of thermal preconditioning current from a third control line through the diode and the MTJ to the first control line; and
a write circuit adapted to write a selected data state to a first selected cell in the array associated with a first block address by applying said write current to the first selected cell, and adapted to concurrently thermally precondition a second selected cell for a subsequent write operation by applying said thermal preconditioning current to the second selected cell having a second block address identified in relation to the first block address.

12. The solid-state memory of claim 11, characterized as a data cache comprising a plurality of data lines, the first selected cell disposed on a first said data line, the second selected cell disposed on a different, second said data line.

13. The solid-state memory of claim 11, further comprising using a timing circuit which establishes a predetermined timing interval during which the thermal preconditioning current is applied to the second selected cell, the write circuit adapted to discontinue further application of the thermal preconditioning current to the second selected cell at a conclusion of said predetermined time interval.

14. The solid-state memory of claim 13, in which the timing circuit uses a resistor-capacitor (RC) voltage decay profile to indicate a conclusion of the predetermined time interval.

15. The solid-state memory of claim 11, in which the first selected cell is in an unconditioned state during application of the write current, and the second selected cell is preconditioned for subsequent programming to a selected data state.

16. The solid-state memory of claim 11, in which the switching device is characterized as a transistor having respective gate, drain and source regions, a drain-source channel of said transistor connected in series with the MTJ.

17. The solid-state memory of claim 11, further comprising a controller which, responsive to receipt of a write command to write the selected data state to the first selected memory cell at the first block address, uses the first block address to identify the second block address of the second selected memory cell so as to predict a future receipt of a subsequent write command for the second memory cell.

18. A method of writing data to a memory, comprising:
applying a write current to an unconditioned first memory cell in a memory array to place the first memory cell in a selected data state, the write current serially passing through an MTJ and a transistor switching device of the first memory cell; and
concurrently thermally preconditioning a second memory cell in the array non-adjacent to the first memory cell by passing a thermal preconditioning current through a diode of the second memory cell to an MTJ of the second memory cell, the second memory cell selected for said preconditioning responsive to a first block address of the first memory cell and a second block address of the second memory cell.

19. The method of claim 18, in which the write current of the applying step passes through the first memory cell between a bit line and a source line, and the thermal preconditioning current passes through the second memory cell between a diode control line to a bit line.

20. The method of claim 18, further comprising receiving a write command to write the selected data state to the first memory cell at the first block address, and using the first block address to identify the second block address of the second memory cell so as to predict a future receipt of a subsequent write command for the second memory cell.

* * * * *